US010554218B1

(12) United States Patent
Seesink

(10) Patent No.: US 10,554,218 B1
(45) Date of Patent: Feb. 4, 2020

(54) SIGMA-DELTA MODULATOR

(71) Applicant: Dialog Semiconductor B.V., s-Hertogenbosch (NL)

(72) Inventor: Petrus Hendrikus Seesink, Ouddorp (NL)

(73) Assignee: Dialog Semiconductor B.V., 's-Hertogenbosch (NL)

( * ) Notice: Subject to any disclaimer, the term of this patent is extended or adjusted under 35 U.S.C. 154(b) by 0 days.

(21) Appl. No.: 16/198,160

(22) Filed: Nov. 21, 2018

(51) Int. Cl.
*H03M 3/00* (2006.01)
*H03F 3/45* (2006.01)

(52) U.S. Cl.
CPC .......... *H03M 3/32* (2013.01); *H03F 3/45273* (2013.01); *H03M 3/458* (2013.01); *H03F 2203/45151* (2013.01); *H03F 2203/45332* (2013.01)

(58) Field of Classification Search
CPC .......... H03M 3/32; H03M 3/458; H03M 1/12; H03M 3/30; H03M 3/50; H03F 3/45273; H03F 2203/45151; H03F 2203/45332
USPC .................................................. 341/143, 155
See application file for complete search history.

(56) References Cited

U.S. PATENT DOCUMENTS 9,154,083 B2 * 10/2015 Ho ........................ H03F 3/265
9,680,496 B2 * 6/2017 Kauffman ............. H03M 3/356
2013/0154863 A1 * 6/2013 Ho ........................ H03F 3/265
                                                                341/143
2015/0180420 A1 * 6/2015 Ho ........................ H03F 3/265
                                                                341/143
2017/0288692 A1 * 10/2017 Kauffman ............. H03M 3/464

OTHER PUBLICATIONS

"Delta-sigma modulation," found on Wikipedia on Nov. 7, 2018, 13 pages.
"A 19nW 33kHz RC Oscillator with ±0.21% Temperature Stability and 4ppm Long-Term Stability," by Danielle Griffith et al., International Solid-State Circuits Conference, Copyright ISSCC 2014, pp. 1-14.
"Current Source & Bias Circuits," by Insoo Kim et al., CSE 577, Spring 2011, Mixed Signal CHIP Design Lab, Department of Computer Science & Engineering, The Pennsylvania State University, 30 pages.

* cited by examiner

*Primary Examiner* — Jean B Jeanglaude
(74) *Attorney, Agent, or Firm* — Saile Ackerman LLC; Stephen B. Ackerman

(57) ABSTRACT

A sigma-delta modulator and method for converting an input voltage such as an analog signal into a digital signal is presented. The modulator may be used as an analog-to-digital converter (ADC). The modulator has a plurality of bias transistors with at least one p-type transistor and at least one n-type transistor. The modulator receives a bias voltage, wherein each bias transistor receives the same bias voltage. This sigma-delta modulator results in reduced power consumption.

19 Claims, 9 Drawing Sheets

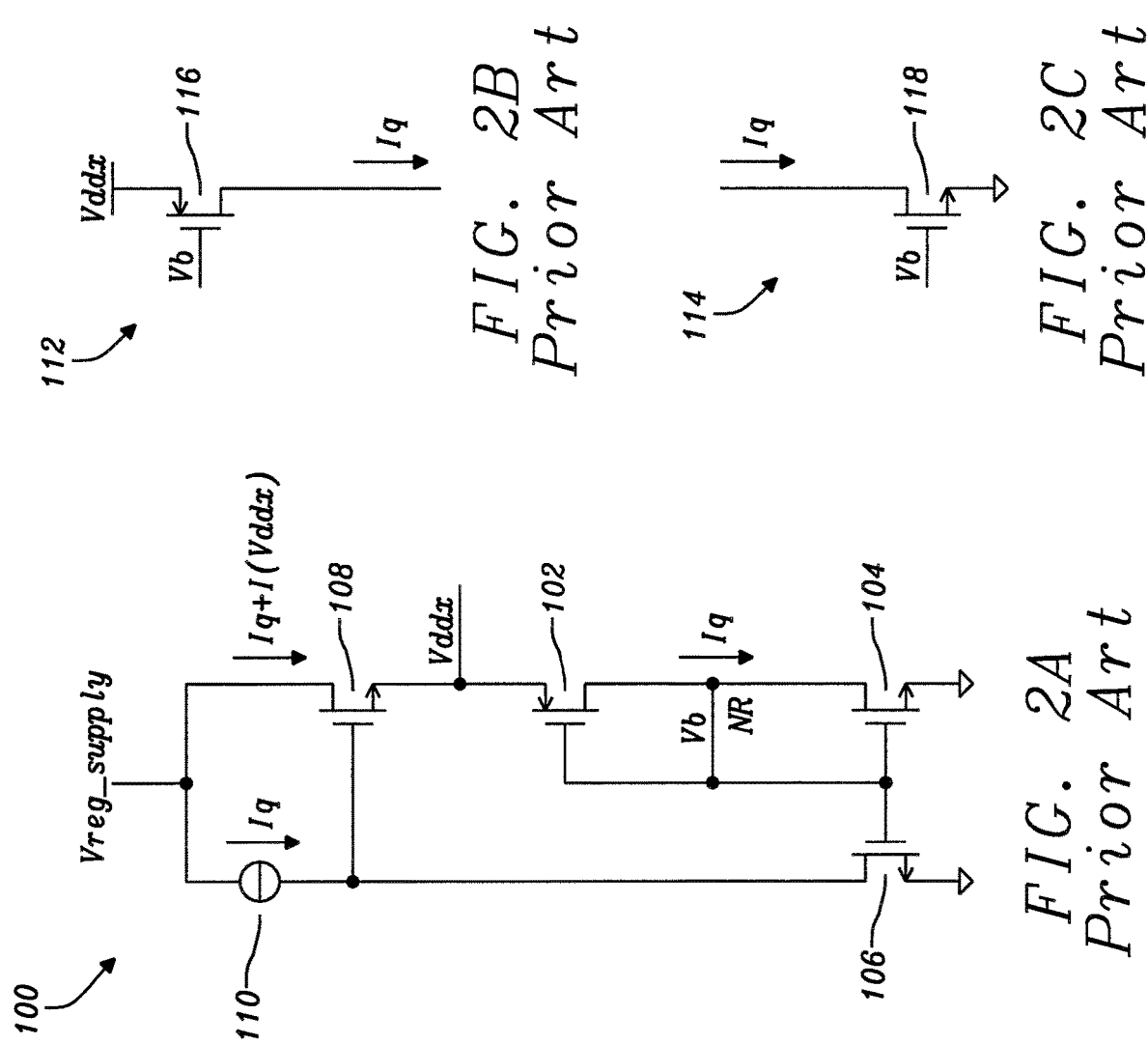

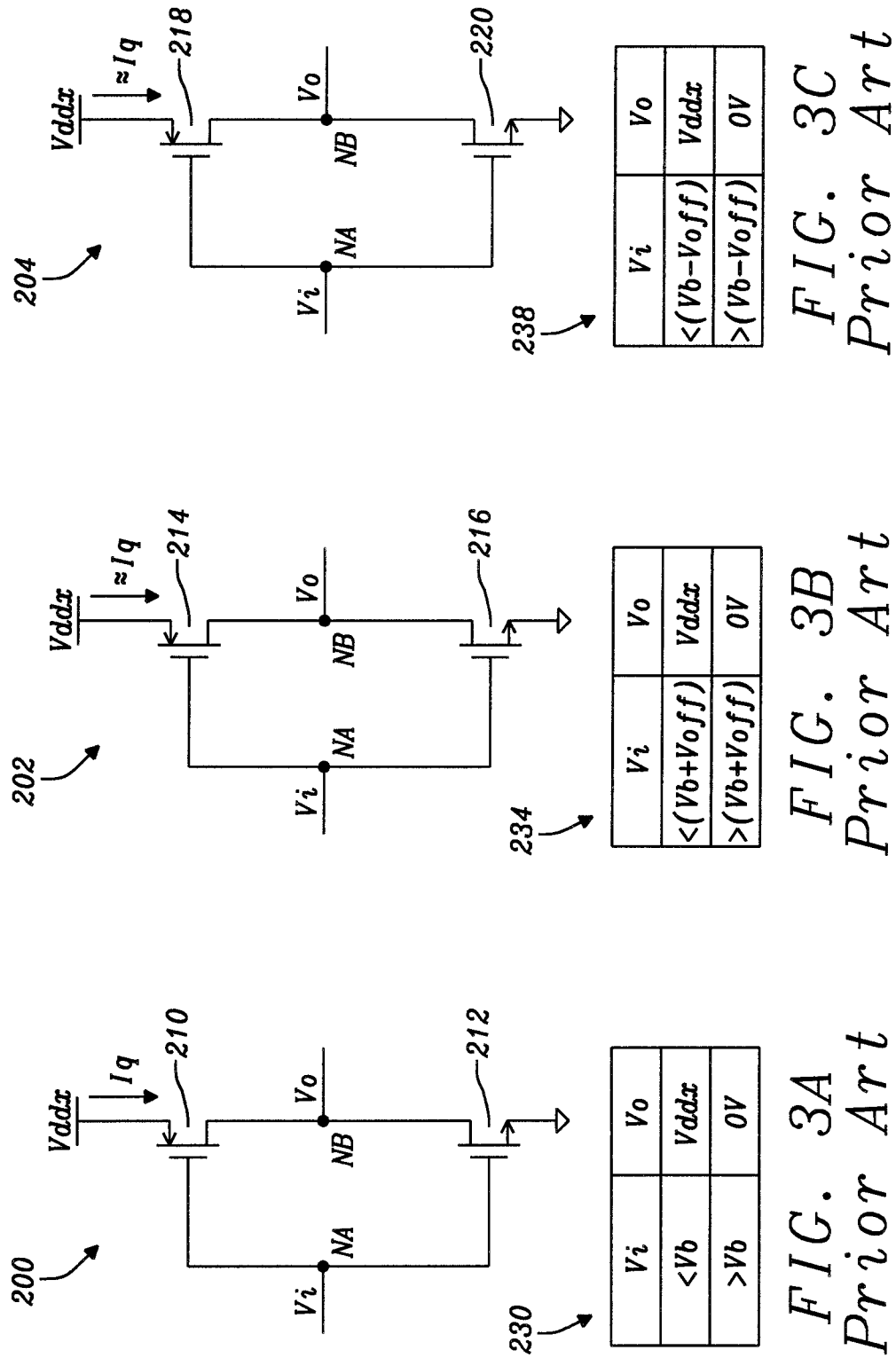

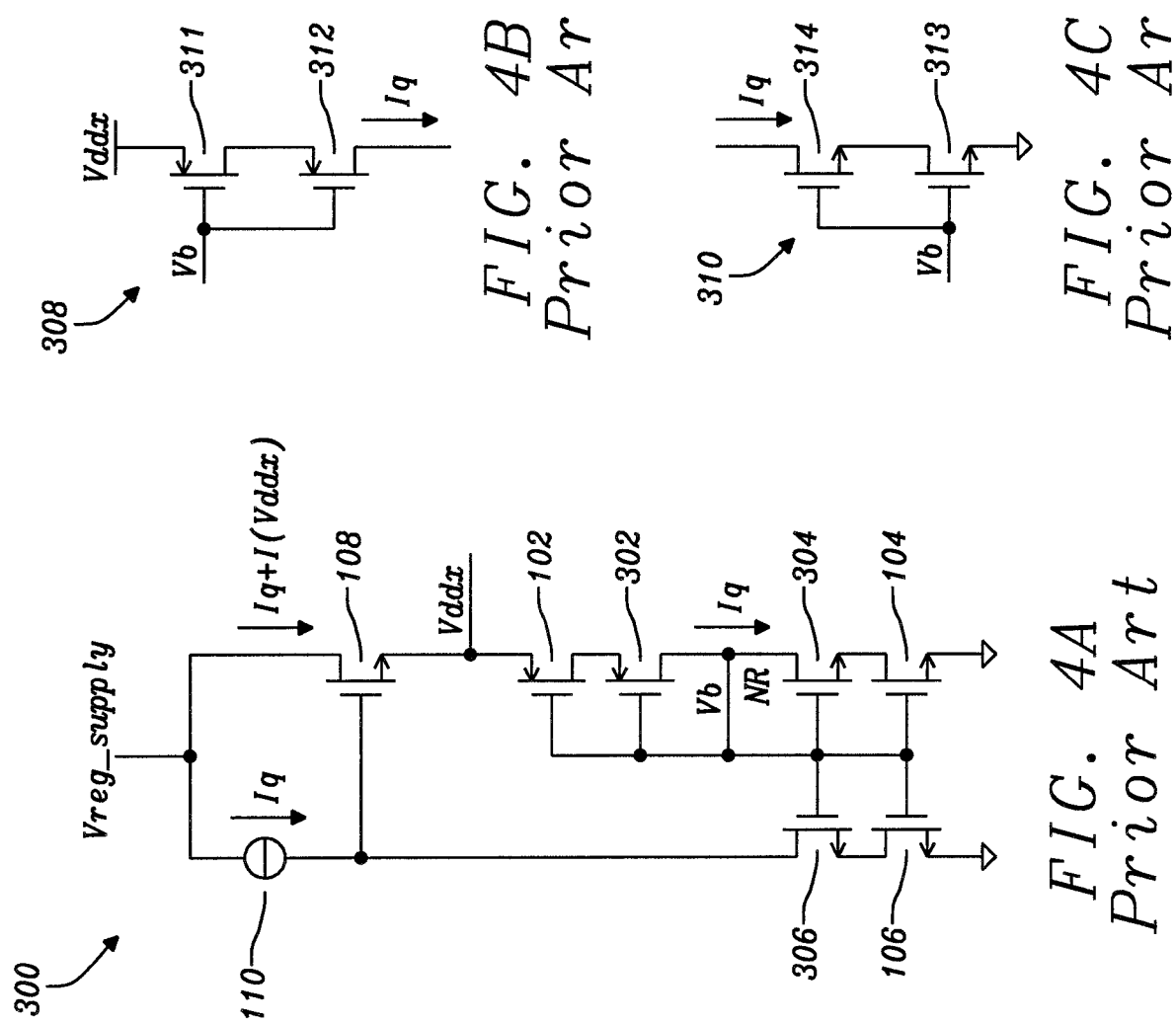

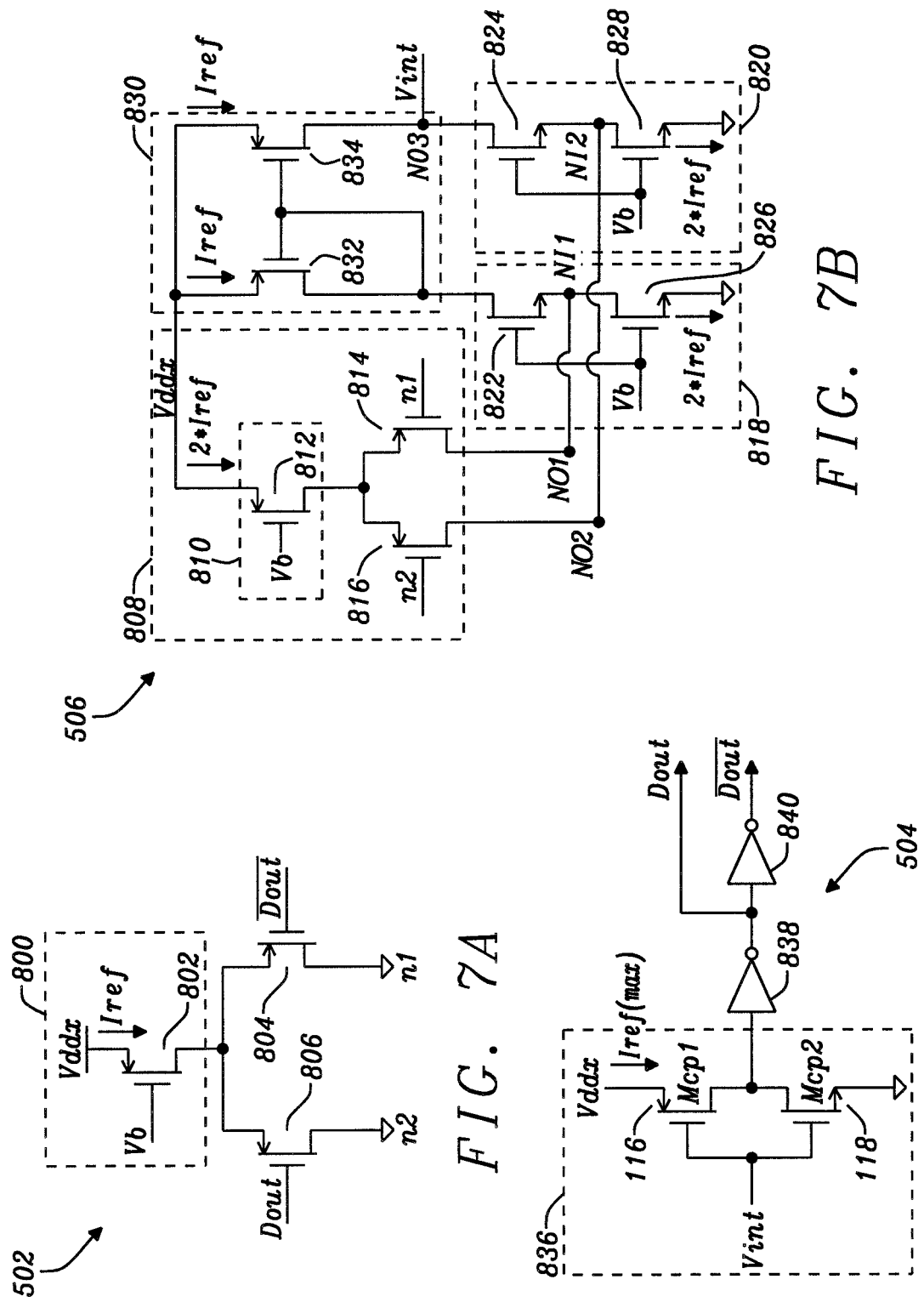

SIGMA-DELTA MODULATOR

TECHNICAL FIELD

The present disclosure relates to a sigma-delta modulator. In particular, this disclosure relates to a sigma-delta modulator comprising multiple transistors configured to receive the same bias voltage.

BACKGROUND

A sigma-delta modulator is a circuit that is used to convert an input voltage, such as an analog signal, into a digital signal, and may be used as an analog to digital converter (ADC).

FIG. 1 (Circuit Diagram by Puffingbilly/https://en.wikipedia.org/wiki/Delta-sigma_modulation/CC BY-SA 4.0/redrawn and labelled) shows a sigma-delta modulator 10 in accordance with the prior art. The sigma-delta modulator 10 comprises an integrator circuit 12, a switching circuit 14, a comparator 16, a flip flop 18, a gate 20, a sigma counter 22, a buffer 24, a summing interval counter 26 and a clock 28.

The integrator circuit 12 comprises an op amp 30, a first capacitor 32 and a first resistor 34. A negative input of the op amp 30 receives an input voltage Vin via the first resistor 34. A positive input of the op amp 30 is coupled to ground. An output of the op amp 30 is coupled to the negative input via the first capacitor 32. The output of the op amp 30 is coupled to a first input of the comparator 16, which has a second input coupled to ground.

The switching circuit 14 comprises a second resistor 36, a third resistor 38 and a switch 40. The switch 40 couples a reference voltage −Vref0 to ground via the second resistor 36 when it is in a first state and couples the reference voltage −Vref0 to the negative input of the op amp 30 via the third resistor 38 when it is in a second state.

An alternative integrator circuit and switching circuit arrangement 42 is also shown. An alternative switching circuit 44 comprising a fourth resistor 46. The integrator circuit 12 is as previously described. Common features between drawings are represented by common reference numerals and variables.

In operation and beginning in a state where −Vref0 is coupled to the second resistor 36 via the switch 40, the input voltage Vin is applied to the integrator circuit 12. If the input voltage Vin is positive, then an output voltage Vint_out of the integrator circuit 12 will decrease with time. The output voltage Vint_out drives the comparator 16 and if Vint_out falls below a threshold voltage value of the comparator 16, an output voltage Vcomp_out of the comparator 16 will be a high signal. The comparator 16 outputs the output voltage Vcomp_out to an input D of the flip flop 18. The high signal received at the input D is provided to, and output by, an output Q at the next clock pulse of a clock signal provided by the clock 28. The output Q is provided to the switch 40 as an impulse signal (labelled impulse). The switch 40 then changes state such that −Vref0 is coupled to the third resistor 38 via the switch 40.

A current of −Vref0/R3 where R3 is the resistance of the third resistor 38, is then injected into the integrator circuit 12. If the input voltage Vin is less than the reference voltage Vref0, the output voltage Vint_out will increase with time until the threshold voltage is crossed and the switch 40 changes to a state where −Vref0 is coupled to the second resistor 36. If the input voltage Vin is greater than the reference voltage Vref0 then the slope of Vint_out will remain negative until it saturates.

Using this method, the output voltage Vcomp_out of the comparator 16 is a pulse-width modulated (PWM) signal with a duty cycle that is linearly proportional to the input voltage Vin.

The role of the remaining circuit components, namely the gate 20, the sigma counter 22, the buffer 24, the summing interval counter 26 is to convert the input voltage Vin into a digital value.

The digital value is a number of clock counts over which the output voltage Vcomp_out of the comparator is a logic 1 (a high signal) during a summing interval. The clock counts are as provided by the clock signal that is provided by the clock 28. The summing interval a total number of clock counts over which a measurement is taken. For example, a digital value of 400 during a summing interval of 1000 clock counts means that the input voltage Vin was at 400/1000 of an input voltage scale.

SUMMARY

A drawback of sigma-delta modulators is the relatively long summing interval that is required to achieve a high precision digital value. The lengthy summing interval wastes both time and power. The time taken may be reduced by using higher order sigma-delta modulators than that shown in FIG. 1, or alternatively by using multi-bit sigma-delta modulators. However, there is still a requirement to reduce the power consumption of sigma-delta modulators.

It is desirable to provide a sigma-delta modulator with reduced power consumption compared to the prior art.

According to a first aspect of the disclosure there is provided a sigma-delta modulator for converting an input voltage into a digital signal, comprising a plurality of bias transistors comprising at least one p-type transistor and at least one n-type transistor and configured to receive a bias voltage, wherein each bias transistor receives the same bias voltage.

Optionally, each of the bias transistors receives the bias voltage at its gate.

Optionally, the sigma-delta modulator is configured to receive a supply voltage from a voltage regulator that is configured to generate the supply voltage and the bias voltage.

Optionally, the sigma-delta modulator comprises a comparator comprising an inverter configured to receive the supply voltage from the voltage regulator, wherein an output voltage of the inverter is dependent on an input voltage received by the inverter, and the bias voltage.

Optionally, the sigma-delta modulator comprises an amplifier circuit comprising at least one of the bias transistors.

Optionally, the sigma-delta modulator comprises an integrator circuit comprising the amplifier circuit.

Optionally, the sigma-delta modulator comprises a switching circuit, wherein the switching circuit comprises a current source, and the current source comprises one of the bias transistors.

Optionally, the sigma-delta modulator comprises an integrator circuit comprising the amplifier circuit, and arranged to generate an integrated voltage signal, wherein the switching circuit is arranged to couple the current source to a first input of the amplifier circuit when in a first state, and the switching circuit is arranged to couple the current source to a second input of the amplifier circuit when in a second state.

Optionally, the switching circuit is configured to change state in response to receiving a feedback signal.

Optionally, the amplifier circuit comprises a current source comprising one of the bias transistors.

Optionally, the amplifier circuit comprises a first cascode current source comprising a first bias transistor configured to generate a first current, and a second bias transistor configured to function as a cascode transistor.

Optionally, the amplifier circuit comprises a second cascode current source comprising a third bias transistor configured to generate a second current, and a fourth bias transistor configured to function as a cascode transistor.

Optionally, the amplifier circuit comprises a current divider, wherein the current divider comprises a current source, and the current source comprises one of the bias transistors.

Optionally, the sigma-delta modulator comprises a comparator arranged to receive the integrated voltage signal and to generate the digital signal.

Optionally, the switching circuit is configured to change state in response to receiving a feedback signal, and the feedback signal is the digital signal generated by the comparator.

Optionally, the sigma-delta modulator comprises a clock for generating a clock signal, and a counting circuit, wherein the counting circuit is arranged to receive the digital signal, and to generate a digital value, the digital value being a number of cycles of the clock signal over which the digital signal is in a high logic state during a measurement period.

Optionally, the sigma-delta modulator is a multi-bit sigma-delta modulator.

Optionally, the amplifier circuit is an operational transconductance amplifier.

According to a second aspect of the disclosure there is provided a method of sigma-delta modulation comprising converting an input voltage into a digital signal, receiving a bias voltage at a plurality of bias transistors comprising at least one p-type transistor and at least one n-type transistor, wherein each bias transistor receives the same bias voltage.

It will be appreciated that the method of the second aspect may include providing and/or using the features set out in the first aspect and can incorporate other features as described herein.

BRIEF DESCRIPTION OF THE DRAWINGS

The disclosure is described in further detail below by way of example and with reference to the accompanying drawings, in which:

FIG. 2A is a schematic of a voltage regulator, also called a low dropout regulator (LDO), FIG. 2B is a schematic of a current source in a sourcing configuration, FIG. 2C is schematic of a current source in a sinking configuration and FIG. 2D is an inverter in accordance with the prior art;

FIGS. 3A-3E show schematics of inverters of the type shown in FIG. 2D arranged in different configurations;

FIG. 4A is a schematic of an LDO for use in cascode circuits, FIG. 4B is a schematic of a cascode current source in a sourcing configuration, FIG. 4C is a schematic of a cascode current source in a sinking configuration, FIG. 4D is a cascode gain stage.

FIG. 7A is a schematic of a switching circuit of the sigma-delta modulator of FIG. 5B, FIG. 7B is a schematic of an OTA of the integrator circuit of FIG. 5B, and FIG. 7C is a schematic of a comparator of the sigma-delta modulator of FIG. 5B).

DESCRIPTION

Figure 1:
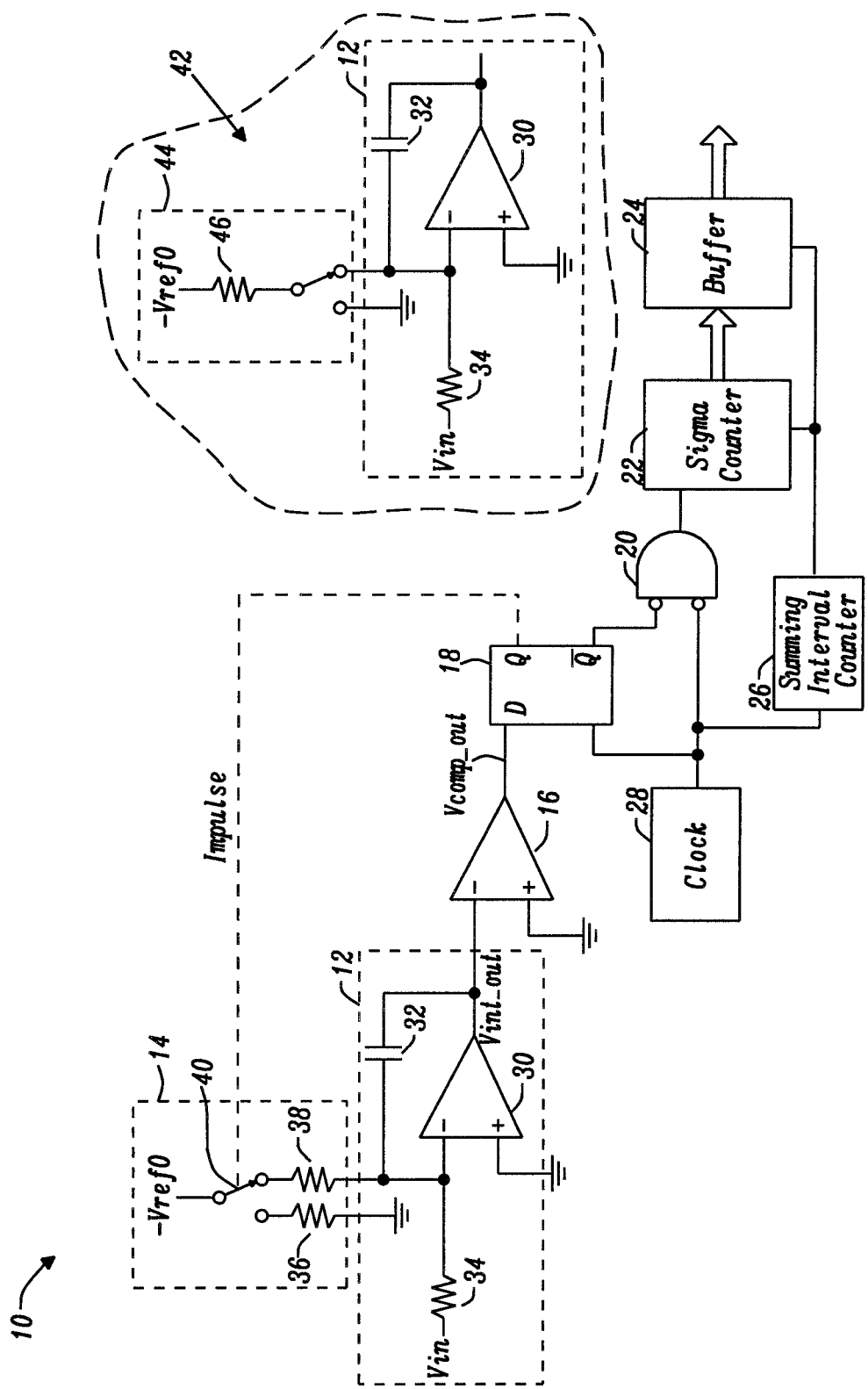
FIG. 1 is a schematic of a sigma-delta modulator in accordance with the prior art.
Figures 3D, 3E:
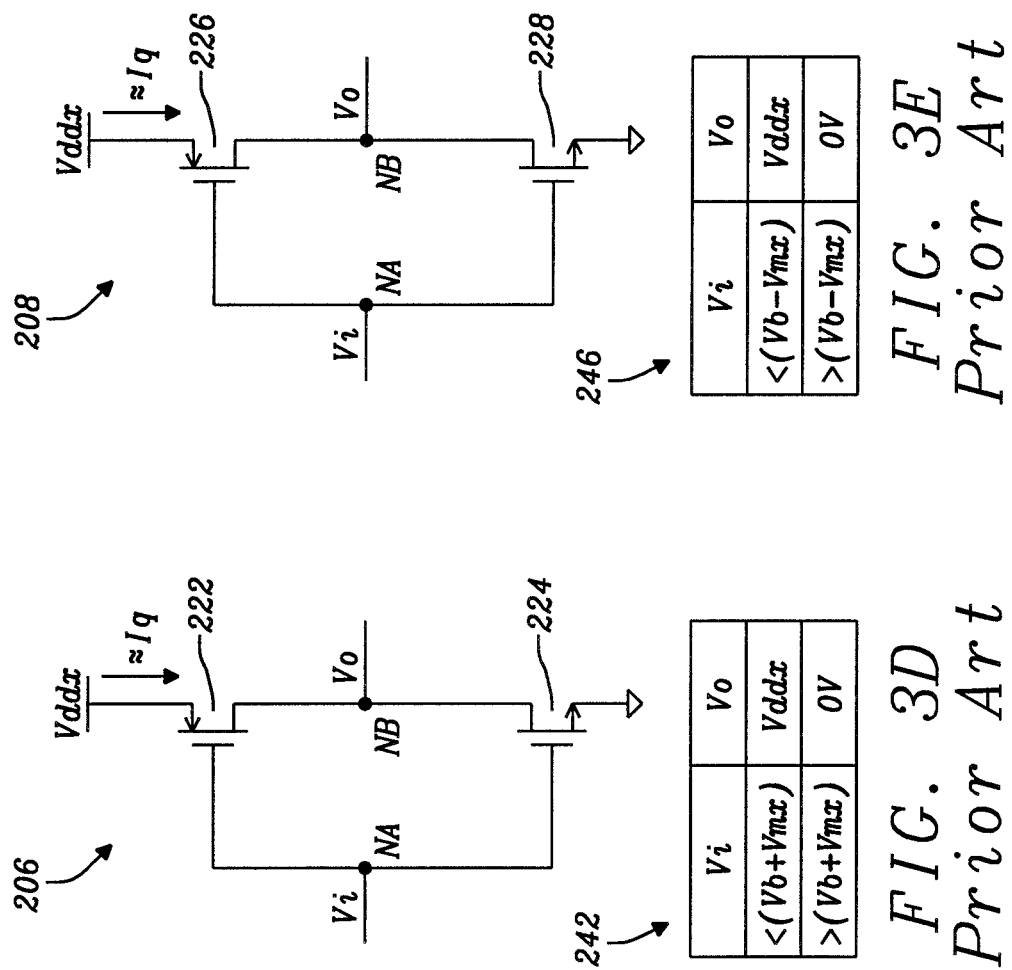

Common bias circuits are circuits comprising transistors where multiple transistors, comprising at least one p-type transistor and at least one n-type transistor, receive the same bias voltage Vb at their gates. The bias voltage Vb may be referred to as a common bias voltage and transistors receiving the bias voltage Vb may be referred to as bias transistors. A common bias circuit may be provided by controlling a supply voltage Vddx to such a level that the gates of each of the p-type and n-type bias transistors of the common bias circuits share a bias voltage Vb. Common bias circuits enable the construction of simpler and high efficiency (chip area and power) analog CMOS circuits.

FIG. 2A shows a schematic of a low dropout regulator (LDO) 100, which is a type of voltage regulator, that may be used to generate the supply voltage Vddx and the bias voltage Vb. Circuits that may be used in common bias circuits may include current sources 112, 114, as shown in FIGS. 2B and 2C. A current source is a type of circuit for providing a substantially constant current.

The output impedance of a current source determines how susceptible its current is to variations of a voltage over the current source. A higher output impedance provides a more constant current that is less susceptible to variations of the voltage over the current source. The relation between the output impedance, the voltage over the current source and the current provided by the current source may be represented by the following equation:

$$Rout = \frac{\Delta Vout}{\Delta Iout}$$

where Rout is the output impedance of the current source, ΔVout is the variation in the voltage across the current source and ΔIout is the variation in current.

FIG. 2D shows a schematic of an inverter 120 which has its turn-over point at the bias voltage Vb. The inverter 120 shown in FIG. 2D is a CMOS inverter and it may operate as a very efficient inverting gain stage for amplification of an input voltage Vi_n. However, the gain of the inverter 120 is relatively low compared with other gain stage circuits. A gain stage may be referred to as an amplifier.

The LDO regulator 100 comprises a plurality of transistors, namely, a first regulator transistor 102, a second regulator transistor 104, a third regulator transistor 106 and a fourth regulator transistor 108. The LDO 100 further comprises a current source 110. The first regulator transistor 102 is a p-type, or PMOS, transistor; and the second, third and fourth regulator transistors 104, 106, 108 are n-type, or NMOS, transistors.

Circuits are presented throughout this disclosure comprising transistors. It will be appreciated that alternative transistor arrangements are possible in accordance with the understanding of the skilled person. For example, it may be possible to replace a p-type transistor with an n-type transistor and/or an n-type transistor with a p-type transistor.

The fourth regulator transistor 108 has a drain coupled to a regulator supply voltage Vreg_supply, a source coupled to a source of the first regulator transistor 102 and a gate coupled to the regulator supply voltage Vreg_supply via the current source 110. The current source 110 is not a physical component but it is used to represent a quiescent current Iq of the LDO 100. The quiescent current Iq may be chosen by the user or circuit designer. A load current I(Vddx) is also shown.

The first regulator transistor 102 has a drain coupled to a drain of the second regulator transistor 104 via a regulator node NR. A source of the second regulator transistor 104 is coupled to ground. A gate of the first regulator transistor 102 is coupled to the regulator node NR, a gate of the second regulator transistor 104 and a gate of the third regulator transistor 106. A source of the third regulator transistor 106 is coupled to ground and a drain of the third regulator transistor 106 is coupled to the gate of the fourth regulator transistor 108.

The LDO 100 generates a supply voltage Vddx which is controlled to provide a common bias voltage Vb to the first, second and third regulator transistors 102, 104, 106. The gates of the first, second and third regulator transistors 102, 104, 106; the drains of the first and second regulator transistors 102, 104; and the regulator node NR are at the common bias voltage Vb.

The bias voltage Vb of the LDO 100 may be used to provide a gate voltage to a transistor to create a current source. An inverter gain stage may be made by coupling two such current sources together. The present disclosure may use the bias voltage Vb as a mid-supply reference voltage.

If regulator transistors 102, 104 have equal threshold voltages Vt and transconductances gm, then the bias voltage Vb will be equal to half of the supply voltage Vddx. The supply voltage Vddx is as follows:

$$Vddx = Vt(102) + Vt(104) + Vod(102) + Vod(104)$$

where Vt(102) and Vt(104) are threshold voltages of regulator transistors 102 and 104, respectively; and Vod(102) and Vod(104) are overdrive voltages of regulator transistors 102 and 104, respectively. A gate source voltage Vgs of a transistor is equal to the sum of its overdrive voltage Vod and its threshold voltage Vt.

FIG. 2B shows a first current source 112 in a sourcing configuration and FIG. 2C shows a second current source 114 in a sinking configuration. A current source is arranged to provide a current. In the sourcing configuration the current source may be coupled to a positive voltage supply, and in the sinking configuration the current source may be coupled to a negative voltage supply.

The first current source 112 comprises a first current source transistor 116 with a source coupled to the supply voltage Vddx generated by the LDO 100 and a gate coupled to the common bias voltage Vb generated by the LDO 100. The second current source 114 comprises a second current source transistor 118 with a source coupled to ground and a gate coupled to the common bias voltage Vb generated by the LDO 100. A drain terminal of the first current source transistor 116 provides an output of the first current source 112 and a drain terminal of the second current source transistor 118 provides an output of the second current source 114.

A current source transistor having a gate coupled to the bias voltage Vb may be referred to as a bias transistor.

A transistor's size may be characterised in terms of its width (W) multiplied by its length (L). The width W is the transistor's channel width and the length L is the transistor's channel length. A transistor may also be characterised in terms of its W/L-ratio which is the ratio of a transistor's channel width to a transistor's channel length.

The W/L-ratio is related to the strength of a transistor. For example, if a first transistor has a width W1 equal to ten times a minimum channel width Wmin and a length L1 equal to a minimum channel length Lmin; and a second transistor has a width W2 equal to the minimum channel width Wmin and a length L2 equal to ten times the minimum channel length Lmin; then the transistors will be of equal size, but the first transistor will be one hundred times stronger than the second transistor due to its greater W/L-ratio.

The first current source 112 provides the quiescent current Iq, as described previously for the LDO 100, when the first regulator transistor 102 is of equal size to the first current source transistor 116. Similarly, the second current source 114 provides the quiescent current Iq when the second regulator transistor 104 is of equal size to the second current source transistor 118. Variations between a regulator transistor of the LDO 100 and its associated current source transistor results in a difference in the current provided by the relevant current source 112, 114. For example, if the W/L-ratio of the first current source transistor 116 is twice that of the first regulator transistor 102, the first current source 112 will provide a current that is twice that of the quiescent current Iq.

The inverter 120 may comprise the first current source 112 and the second current source 114 coupled together. The gain of the inverter 120 results from the output impedance of each of the current sources 112, 114. The inverter 120 may be referred to as an inverter gain stage, a gain stage, or a comparator.

The gain of the inverter 120 (Gain) may be represented as follows:

$$Gain = (gm(116) + gm(118)) \times Routput$$

where gm(116) is the transconductance of the first current source transistor 116, and gm(118) is the transconductance of the second current source transistor 118. Routput is an output impedance of the inverter 120. The transconductances of the current source transistors 116, 118 is as follows:

$$gm(116) = \frac{\Delta Ids(116)}{\Delta Vgs(116)}$$

$$gm(118) = \frac{\Delta Ids(118)}{\Delta Vgs(118)}$$

where ΔIds(116) is the change in drain-source current of the first current source transistor 116, ΔVgs(116) is the change in gate-source voltage of the first current source transistor 116; and ΔIds(118) is the change in drain-source current of the second current source transistor 118, ΔVgs(118) is the change in gate-source voltage of the second current source transistor 118. Routput is as follows:

$$Routput = \frac{1}{\frac{1}{Rds(116)} + \frac{1}{Rds(118)}}$$

where Rds(116) is a drain-source resistance of the first current source transistor 116 and Rds(118) is a drain-source resistance of the second current source transistor 118.

The gate of the first current source transistor 116 is coupled to the gate of the second current source transistor 118 at an input node NA. In the inverter 120, the gates of the first current source transistor 116 and the second current source transistor 118 are not coupled to the common bias voltage Vb as is the case in the first current source 112 and the second current source 114. A drain of the first current source transistor 116 is coupled to a drain of the second current source transistor 118 at an output node NB.

In operation, an input voltage Vi_n is received at the input node NA and an output voltage Vout is provided at the output node NB. As the supply voltage Vddx is provided by the LDO 100, which is used to maintain the common bias voltage Vb, the relation between the input voltage Vi_n and the output voltage Vout is linked to the common bias voltage Vb as is described below.

The first, second and third regulator transistors 102, 104, 106 may be appropriately sized such that their transconductances are approximately equal. For equal W/L-ratios, a p-type transistor will typically have half the transconductance of an n-type transistor. Therefore, for a p-type transistor and an n-type transistor to have an equal transconductance, the p-type transistor's W/L-ratio should be approximately equal to twice the W/L-ratio of the n-type transistor. The second and third regulator transistors 104, 106 may be of equal size.

FIGS. 3A-3E shows schematics of a first inverter 200, a second inverter 202, a third inverter 204, a fourth inverter 206 and a fifth inverter 208. Each of the five inverters 200, 202, 204, 206, 208 correspond to the inverter 120 of FIG. 2D but with the sizes of current source transistors 116, 118 being chosen to define different values of turn-over voltage Vto. The turn-over voltage Vto may also be referred to as the turn-over point. The role of the turn-over voltage Vto in the operation of the inverters 200, 202, 204, 206, 208 is described below.

The size of the first regulator transistor 102 relative to the first current source transistor 116; and the size of the second regulator transistor 104 relative to the second current source transistor 118 defines the turn-over voltage Vto of the inverter 120.

Each of the inverters 200, 202, 204, 206, 208 are arranged to operate as comparators that receive an input voltage Vi and output either a logic high or a logic low signal depending on a comparison between the input voltage Vi and the turn-over voltage Vto. The logic high signal may be equal to the supply voltage Vddx and the logic low signal may be equal to a reference value such as 0V.

The input voltage Vi may more generally be referred to as "a signal". Each of the inverters 200, 202, 204, 206, 208 receives a signal and may invert the signal, depending on the relation between the input voltage Vi and the turn-over voltage Vto, as is described in further detail below.

When the input voltage Vi is less than the turn-over voltage Vto, the inverter outputs a high signal, and when the input voltage Vi is greater than the turn-over voltage Vto, the inverter outputs a low signal. At the turn over point, when the input voltage Vi is approximately equal to the turn-over voltage Vto, the quiescent current Iq as defined previously will flow through the inverter 200, 202, 204, 206, 208.

The first inverter 200 comprises a first gain stage transistor 210 and a second gain stage transistor 212; the second inverter 202 comprises a first gain stage transistor 214 and a second gain stage transistor 216; the third inverter 204 comprises a first gain stage transistor 218 and a second gain stage transistor 220; the fourth inverter 206 comprises a first gain stage transistor 222 and a second gain stage transistor 224; and the fifth inverter 208 comprises a first gain stage transistor 226 and a second gain stage transistor 228.

The first gain stage transistors 210, 214, 218, 222, 226 correspond to the first current source transistor 116 and the second gain stage transistors 212, 216, 220, 224, 228 correspond to the second current source transistor 118 of the inverter 120.

In the first inverter 200, the first gain stage transistor 210 is of equal size to the first regulator transistor 102 of the LDO 100 providing the supply voltage Vddx; and the second gain stage transistor 212 is of equal size to the second regulator transistor 104 of the LDO 100 providing the supply voltage Vddx.

A first table 230 shows an output voltage Vo of the of the first inverter 200 for an input voltage Vi that is greater than the turn-over voltage Vto and for an input voltage Vi that is less than the turn-over voltage Vto. For the first inverter 200 the turn-over voltage Vto is equal to the common bias voltage Vb. If the input voltage Vi is less than the common bias voltage Vb, the output voltage Vo is equal to the supply voltage Vddx; and if the input voltage Vi is greater than the common bias voltage Vb, the output voltage Vo is equal to 0V.

An offset to the turn-over voltage Vto is provided by varying the size of the gain stage transistors 214, 216 218, 220 222, 224, 226, 228 compared to the gain stage transistors 210, 212, which are matched to the regulator transistors 102, 104, 106.

In the second inverter 202, the first gain stage transistor 214 has a greater W/L-ratio than the first regulator transistor 102 of the LDO 100 providing the supply voltage Vddx; and the second gain stage transistor 216 has a smaller W/L-ratio the second regulator transistor 104 of the LDO 100 providing the supply voltage Vddx.

A second table 234 shows an output voltage Vo of the of the second inverter 202 for an input voltage Vi that is greater than the turn-over voltage Vto and for an input voltage Vi that is less than the turn-over voltage Vto. For the second inverter 202 the turn-over voltage Vto is equal to the common bias voltage Vb plus an offset voltage Voff. If the input voltage Vi is less than the common bias voltage Vb plus the offset voltage Voff, the output voltage Vo is equal to the supply voltage Vddx; and if the input voltage Vi is greater than the common bias voltage Vb plus the offset voltage Voff, the output voltage Vo is equal to 0V.

In the third inverter 204, the first gain stage transistor 218 is smaller in size than the first regulator transistor 102 of the LDO 100 providing the supply voltage Vddx; and the second gain stage transistor 220 is greater in size than the second regulator transistor 104 of the LDO 100 providing the supply voltage Vddx.

A third table 238 shows an output voltage Vo of the of the third inverter 204 for an input voltage Vi that is greater than the turn-over voltage Vto and for an input voltage Vi that is less than the turn-over voltage Vto. For the third inverter 204 the turn-over voltage Vto is equal to the common bias voltage Vb minus the offset voltage Voff. If the input voltage Vi is less than the common bias voltage Vb minus the offset voltage Voff, the output voltage Vo is equal to the supply voltage Vddx; and if the input voltage Vi is greater than the common bias voltage Vb minus the offset voltage Voff, the output voltage Vo is equal to 0V.

In the fourth inverter 206, the first gain stage transistor 222 is much greater in size than the first regulator transistor 102 of the LDO 100 providing the supply voltage Vddx; and the second gain stage transistor 224 is much smaller in size than the second regulator transistor 104 of the LDO 100 providing the supply voltage Vddx.

A fourth table 242 shows an output voltage Vo of the of the fourth inverter 206 for an input voltage Vi that is greater than the turn-over voltage Vto and for an input voltage Vi that is less than the turn-over voltage Vto. For the fourth inverter 206 the turn-over voltage Vto is equal to the common bias voltage Vb plus a maximum offset voltage Vmx. If the input voltage Vi is less than the common bias voltage Vb plus the maximum offset voltage Vmx, the output voltage Vo is equal to the supply voltage Vddx; and if the input voltage Vi is greater than the common bias voltage Vb plus the maximum offset voltage Vmx, the output voltage Vo is equal to 0V.

In the fifth inverter 208, the first gain stage transistor 226 is much smaller in size than the first regulator transistor 102 of the LDO 100 providing the supply voltage Vddx; and the second gain stage transistor 228 is much greater in size than the second regulator transistor 104 of the LDO 100 providing the supply voltage Vddx.

A fifth table 246 shows an output voltage Vo of the of the fifth inverter 208 for an input voltage Vi that is greater than the turn-over voltage Vto and for an input voltage Vi that is less than the turn-over voltage Vto. For the fifth inverter 208 the turn-over voltage Vto is equal to the common bias voltage Vb minus a maximum offset voltage Vmx. If the input voltage Vi is less than the common bias voltage Vb minus the maximum offset voltage Vmx, the output voltage Vo is equal to the supply voltage Vddx; and if the input voltage Vi is greater than the common bias voltage Vb minus the maximum offset voltage Vmx, the output voltage Vo is equal to 0V.

It is possible to achieve a greater offset to the voltage turn-over Vto by providing a greater voltage offset than the maximum offset voltage Vmx. This may be achieved by using different transistors with different threshold voltages.

For a practical system it is estimated that the quiescent current Iq of the LDO 100 may be in the nano-ampere range. Therefore, when the LDO 100 provides the supply voltage Vddx and the bias voltage Vb to any of the inverters 200, 202, 204, 206, 208 of FIGS. 3A-3E, their respective quiescent currents Iq are well defined enabling each of the inverters to operate as a gain stage to amplify the input voltage Vi_n when provided with feedback, or alternatively to operate as comparators when there is no feedback.

Alternatively, an inverter may be configured to comprise multiple voltage turn-overs Vto. For example, upon receiving the input voltage signal, the inverter may output a first voltage signal when the input voltage signal is less than a first voltage turn-over and may output a second voltage signal when the input voltage signal is greater than a second voltage turn-over. The first voltage signal may be a logic high signal and the second voltage signal may be a logic low signal. Both the first and second turn-over voltages may be equal, as described previously. As the inverter receives the supply voltage from the LDO 100, one or both of the first voltage turn-over and the second voltage turn-over may be dependent on the bias voltage Vb.

Inverters 120 with a supply voltage Vddx that is fixed may have a voltage turn-over Vto that varies depending on supply voltage Vddx, temperature and processing corners. Processing corners refers to the variation in the properties of components in a circuit between different wafers, chips and batches. Using a supply voltage Vddx that is fixed may result in a poorly controlled quiescent current Iq. For example, two current sources 112 of the type shown in FIG. 2(b) that are fabricated on different wafers may provide unequal currents at their outputs. Also, two inverters 120 fabricated on different wafers may have different voltage turn-overs Vto.

The LDO 100 may provide a supply voltage Vddx that is not fixed and can vary depending on such aspects as temperature and processing corners. Therefore, by using a voltage regulator such as the LDO 100, the quiescent current Iq may be well controlled. For example, consider two inverters 120 fabricated on different wafers, each with the first current source transistor 116 of equal size to the first regulator transistor 102 and the second current source transistor 118 of equal size to the second regulator transistor 104. By using the LDO 100 with a supply voltage Vddx that can vary, each of the two inverters 120 will exhibit the same turn-over point at the bias voltage Vb and the quiescent current Iq of the inverters 120 will be well controlled and equal to the quiescent current Iq of the LDO 100 at the turn-over point, as described previously. The supply voltage Vddx and the bias voltage Vb generated by the LDO 100 are processing corner and temperature dependent.

FIG. 4A shows an LDO 300 which is used to generate the supply voltage Vddx and the common bias voltage Vb. The LDO 300 is as described for the LDO 100 as shown in FIG. 2(a), however the LDO 300 further comprises a plurality of cascode regulator transistors. The plurality of cascode regulator transistors comprises a first cascode regulator transistor 302, a second cascode regulator transistor 304 and a third cascode regulator transistor 306. The first cascode regulator transistor 302 is a p-type, or PMOS transistor; and the second and third cascode regulator transistors 304, 306 are n-type, or NMOS transistors. Common features between drawings are represented by common reference numerals and variables.

The first cascode regulator transistor 302 is coupled between the first regulator transistor 102 and the regulator node NR; and the second cascode regulator transistor 304 is coupled between the regulator node NR and the second regulator transistor 104.

A source of the first cascode regulator transistor 302 is coupled to the drain of the first regulator transistor 102; and a drain and a gate of the first cascode regulator transistor 302 are coupled to the regulator node NR.

A source of the second cascode regulator transistor 304 is coupled to the drain of the second regulator transistor 104; and a drain and a gate of the second cascode regulator transistor 304 are coupled to the regulator node NR.

A source of the third cascode regulator transistor 306 is coupled to the drain of the third regulator transistor 106; a gate of the third cascode regulator transistor 306 is coupled to the regulator node NR; and a drain of third cascode regulator transistor 306 is coupled to the gate of the fourth regulator transistor 108.

The first, second and third cascode regulator transistors 302, 304, 306 have a much greater W/L-ratio than the first, second and third regulator transistors 102, 104, 106, respectively.

FIG. 4B shows a first cascode current source 308 in a sourcing configuration and FIG. 4C shows a second cascode current source 310 in a sinking configuration. The cascode current sources 308, 310 are as described for the current sources 112, 114, however each of the cascode current sources 308, 310 further comprise a cascode transistor: the first cascode current source 308 comprises a first cascode transistor 312 and the second cascode current source 310 comprises a second cascode transistor 314. The first cascode transistor 312 is a p-type transistor and the second cascode transistor 314 is an n-type transistor. The first cascode current source 308 comprises a first current source transistor 311 that corresponds to the first current source transistor 116, and the second cascode current source 310 comprises a second current source transistor 313 that corresponds to the second current source transistor 118, as previously described.

The first cascode transistor 312 has a gate coupled to the bias voltage Vb and a source coupled to a drain of the first current source transistor 311. The second cascode transistor 314 has a gate coupled to the bias voltage Vb and a source coupled to a drain of the second current source transistor 313.

FIG. 4D shows a cascode gain stage 316, which comprises the first cascode current source 308 and the second cascode current source 310 coupled together. The gate of the first current source transistor 311 is coupled to the gate of the second current source transistor 313 at an input node NA. In the cascode gain stage 316, the gates of the first current source transistor 311 and the second current source transistor 313 are not coupled to the common bias voltage Vb, as is the case in the first cascode current source 308 and the second cascode current source 310. A drain of the first cascode transistor 312 is coupled to a drain of the second cascode transistor 314 at an output node NB. The gates of the cascode transistors 312, 314 are coupled to the bias voltage Vb.

As for the inverter 120, in operation, an input voltage Vi_n is received at the input node NA and an output voltage Vout is provided at the output node NB. As the supply voltage Vddx is provided by the LDO 300, which is used to maintain the common bias voltage Vb, the relation between the input voltage Vi_n and the output voltage Vout is linked to the common bias voltage Vb.

The inclusion of cascode transistors 312, 314 means that the cascode current sources 308, 310 have a greater output impedance than that of the current sources 112, 114; and the cascode gain stage 316 has a greater open loop gain than that of the inverter 120.

The output impedance of the first current source 112 is equal to a drain-source impedance of the first current source transistor 116 and in a practical implementation of the first cascode current source 308, the output impedance of the first cascode current source 308 may, for example, be equal to approximately ten times a drain-source impedance of the first current source transistor 311.

The output impedance of the second current source 114 is equal to a drain-source impedance of the second current source transistor 118 and in a practical implementation of the second cascode current source 310 the output impedance of the second cascode current source 310 may, for example, be equal to approximately ten times a drain-source impedance of the second current source transistor 313.

The output impedance of two current sources coupled together to form an inverter gain stage determine the open loop gain of the inverter gain stage. For a practical system it is estimated that the open loop gain of the inverter 120 will be approximately equal to 40 dB and the open loop gain of the cascode gain stage 316 will be equal to approximately 60 dB.

The first cascode transistor 312 is greater in size and has a greater W/L-ratio than the first current source transistor 311. Preferably the W/L-ratio of the first current source transistor 311 has the same W/L-ratio as the first regulator transistor 102. Preferably the W/L-ratio of the first cascode transistor 312 has the same W/L-ratio as the first cascode regulator transistor 302.

Consequently, a gate-source voltage of the first cascode transistor 312 is smaller than a gate-source voltage of the first current source transistor 311. This provides a drain-source voltage of the first current source transistor 311 that is greater than a saturation voltage Vdssat of the first current source transistor 311 such that the first current source transistor 311 operates in its saturation region. Additionally, the inclusion of the first cascode transistor 312 acts to maintain a substantially constant drain-source voltage of the first current source transistor 311, as a voltage over the first cascode current source 308 varies. The substantially constant drain-source voltage of the first current source transistor 311 acts to maintain a substantially constant current provided by the first cascode current source 308. Preferably the first cascode transistor 312 also operates in its saturation region.

The second cascode transistor 314 is greater in size and has a greater W/L-ratio than the second current source transistor 313. Preferably the W/L-ratio of the second current source transistor 313 has the same W/L-ratio as the second regulator transistor 104. Preferably the W/L-ratio of second cascode transistor 314 has the same W/L-ratio as the second cascode regulator transistor 304.

Consequently, a gate-source voltage of the second cascode transistor 314 is smaller than a gate-source voltage of the second current source transistor 313. This provides a drain-source voltage of the second current source transistor 313 that is greater than a saturation voltage Vdssat of the second current source transistor 313 such that the second current source transistor 313 operates in its saturation region. Additionally, the inclusion of the second cascode transistor 314 acts to maintain a substantially constant drain-source voltage of the second current source transistor 313 as a voltage over the second cascode current source 310 varies. The substantially constant drain-source voltage of the second current source transistor 313 acts to maintain a substantially constant current provided by the second cascode current source 310. Preferably the second cascode transistor 314 also operates in its saturation region.

Figures 4E, 4F, 4G:
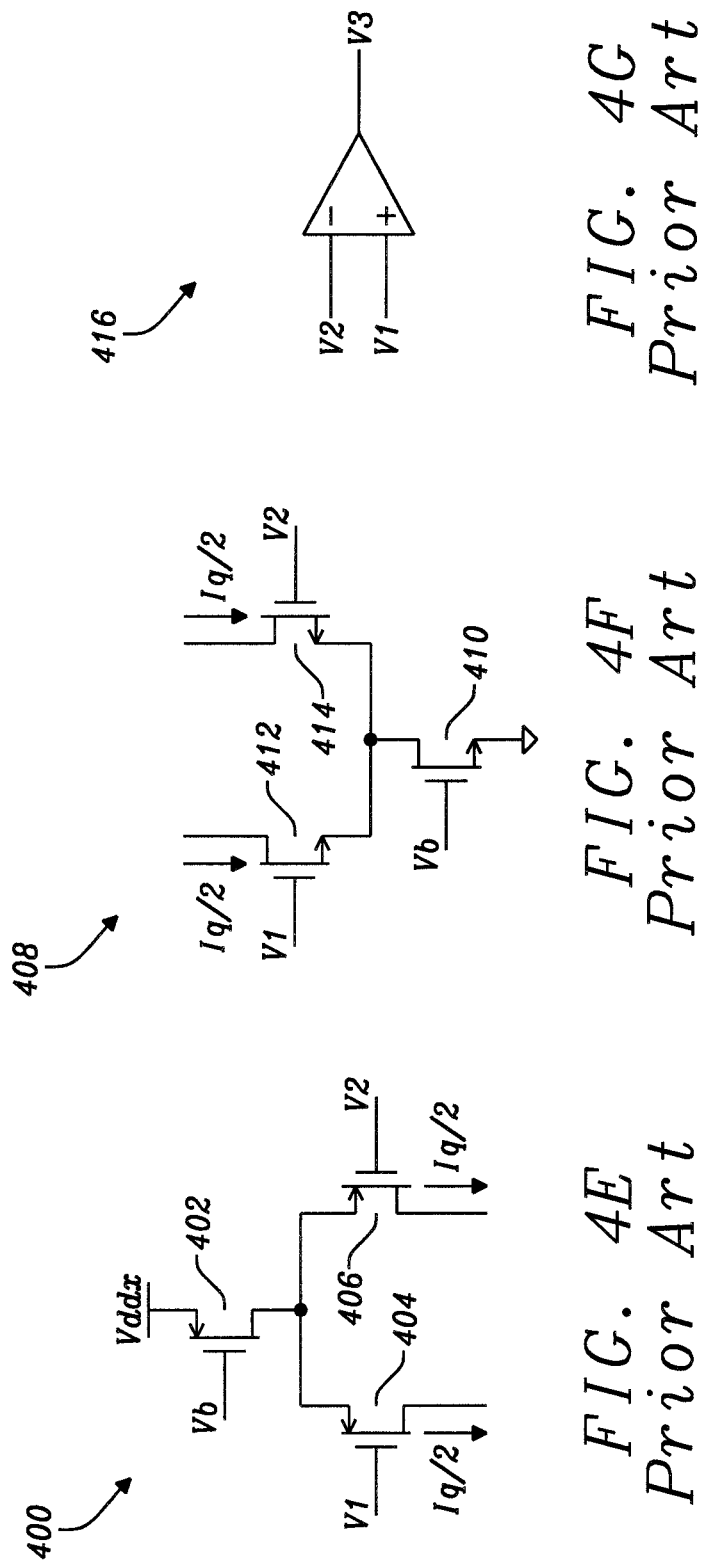
FIG. 4E is a schematic of a current divider in a sourcing configuration.
FIG. 4F is a schematic of a current divider in a sinking configuration and FIG. 4G is a schematic of an operational transconductance amplifier (OTA) in accordance with the prior art.

FIG. 4E is a schematic of a current divider 400 in a sourcing configuration and comprising a current source transistor 402 that has a source coupled to the supply voltage Vdd, a gate coupled to the bias voltage and a drain coupled to a source of cascode transistor 404 and a source of a cascode transistor 406. The cascode transistors 404 and 406 receive an input voltage V1 and an input voltage V2 at their respective gates. For cascode transistors 404, 406 of equal size, the current divider 400 acts to divide the current Iq provided by the current source transistor 402 by half such that a current Iq/2 flows through each of the cascode transistors 404, 406 when the input voltages V1, V2 are approximately equal. It is necessary that the input voltages V1, V2 are approximately equal to, or less than, the bias voltage Vb to operate the current source transistor 402 in saturation.

The cascode transistors 404, 406 may, for example, each be half the size of the cascode transistor 312. The current source transistor 402 may be of equal size to the current source transistor 311.

FIG. 4F is a schematic of a current divider 408 in a sinking configuration comprising a current source transistor 410 and cascode transistors 412, 414. The operation of the current divider 408 will be clear to the skilled person based on the description for the current divider 400. It is necessary that the input voltages V1, V2 are approximately equal to, or greater than, the bias voltage Vb to operate the current source transistor 410 in saturation.

The cascode transistors 412, 4141 may, for example, each be half the size of the cascode transistor 314. The current source transistor 410 may be of equal size to the current source transistor 313.

FIG. 4G is an operational transconductance amplifier (OTA) 416 that is configured to receive the input voltages V1, V2 and provide an output voltage V3. The OTA 416 comprises the current divider 400 and/or the current divider 408.

If there is no network connected to the output of the OTA 416 then the output voltage V3 is equal to a0×(V1−V2), where a0 is the open loop gain of the OTA 416.

In a practical implementation of the current divider 400, the output impedance may, for example, be equal to approximately twenty times a drain-source impedance of the current source transistor 402. In a practical implementation of the current divider 408, the output impedance may, for example, be equal to approximately twenty times a drain-source impedance of the current source transistor 410. For a practical system it is estimated that the open loop gain of the OTA 416 may range from 40 dB to 120 dB.

In the present disclosure, there is provided a common bias sigma-delta modulator. The power efficiency provided by a common bias configuration acts to reduce the power consumption and voltage requirements of the sigma-delta modulator.

Figures 5A, 5B:
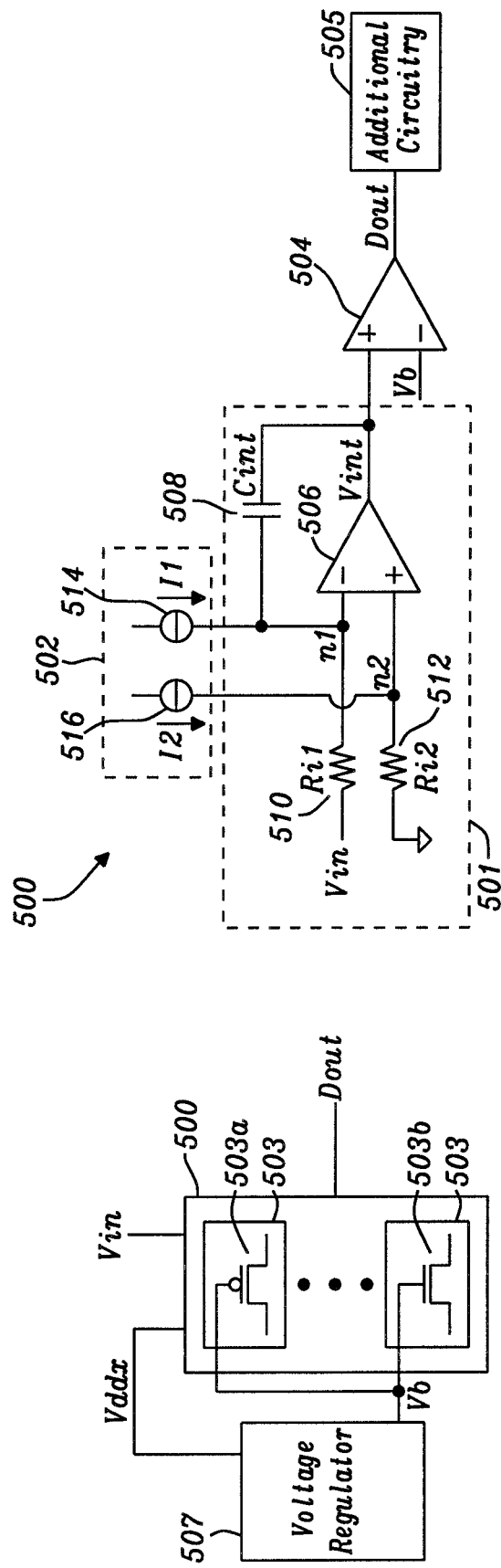
FIG. 5A is a schematic of a sigma-delta modulator in accordance with a first embodiment of this disclosure and FIG. 5B is a schematic of a sigma-delta modulator in accordance with a second embodiment of this disclosure.

FIG. 5A shows a schematic of a sigma-delta modulator 500 in accordance with a first embodiment of this disclosure. The sigma-delta modulator 500 is a common bias sigma-delta modulator 500.

The sigma-delta modulator 500 may be used to convert an input voltage Vin into a digital signal Dout. The sigma-delta modulator 500 comprises a plurality of bias transistors 503, comprising at least one p-type transistor 503a and at least one n-type transistor 503b and configured to receive a bias voltage Vb, where each bias transistor 503 receives the same bias voltage Vb. Each bias transistor 503 is configured to receive the bias voltage Vb at its gate.

As discussed previously, a current source transistor having a gate coupled to the bias voltage Vb may be referred to as a bias transistor. The p-type transistor 503a may be referred to as a p-type current source and the n-type transistor 503b may be referred to as an n-type current source.

The sigma-delta modulator 500 may be referred to as a common bias circuit as it comprises at least one p-type transistor 503a and at least one n-type transistor 503b configured to receive the same bias voltage Vb.

The sigma-delta modulator 500 is configured to receive a supply voltage Vddx from a voltage regulator 507 that is configured to generate the supply voltage Vddx and the bias voltage Vb. The voltage regulator 507 may correspond to any of the voltage regulators 100, 300 as described previously, or any other suitable voltage regulator in accordance with the understanding of the skilled person.

FIG. 5B shows a schematic of a specific implementation of the sigma-delta modulator 500 in accordance with a second embodiment of this disclosure and comprising an integrator circuit 501, a switching circuit 502, a comparator 504 and additional circuitry 505. The sigma-delta modulator 500 may correspond to the sigma-delta modulator 10, where the integrator circuit 501 may correspond to the integrator circuit 12; the switching circuit 502 may correspond to the switching circuit 14; the comparator 504 may correspond to the comparator 16; and the additional circuitry 505 may comprise the flip flop 18, the gate 20, the sigma counter 22, the buffer 24, the summing interval counter 26 and the clock 28.

By omitting the additional circuitry 505 the sigma-delta modulator 500 is shown as a time-continuous loop, that is free running and does not include a clock.

The additional circuitry 505 may comprise a clock for generating a clock signal and counting circuit. The counting circuit may be arranged to receive the digital signal Dout and to generate a digital value, where the digital value is a number of cycles of the clock signal over which the digital signal Dout is in a high logic state during a measurement period.

By adding the logic gates and the clock, as illustrated in FIG. 1 and provided as part of the additional circuit 505, the sigma-delta modulator 500 is a clocked sigma-delta modulator. It will be appreciated that it is possible to implement the sigma-delta modulator 500 either without the additional circuitry 505, as a time continuous loop, or with the additional circuitry 505 as a clocked sigma-delta modulator.

A level shifter configured to shift the supply voltage Vddx to a second supply voltage Vdd may be inserted between the comparator 504 output and the additional circuitry 505 if the digital gates of the additional circuitry 505, such as the gate 20, operates at a voltage other than the supply voltage Vddx.

The sigma-delta modulator 500 may be referred to as a common bias sigma-delta oscillator. In particular, each of the integrator circuit 501 and the switching circuit 502 receive the common bias voltage Vb, and the operation of the comparator 504 is dependent on the common bias voltage Vb. It will be appreciated that in further embodiments, a common bias sigma-delta modulator may comprise any one or two of the integrator circuit 501, the switching circuit 502 and the comparator 504, in accordance with the understanding of the skilled person.

The sigma-delta modulator 500 comprises a first order loop, however higher order sigma-delta modulators may implement the common bias methods described herein, and in accordance with the understanding of the skilled person.

The integrator circuit 501 comprises an amplifier circuit, in this embodiment implemented as an OTA 506, a first capacitor 508 (also labelled Cint), a first resistor 510 (also labelled Ri1) and a second resistor 512 (also labelled Ri2). A negative input, which may be referred to as a first input, of the OTA 506 receives an input voltage Vin via the first resistor 510. A positive input, which may be referred to as a second input, of the OTA 506 is coupled to ground via the second resistor 512. An output of the OTA 506 is coupled to the negative input via the first capacitor 508. The output of OTA 506, and therefore an output of the integrator circuit 501, is an integrated voltage signal Vint. The output of OTA 506 is coupled to a first input of the comparator 504 and a second input of the comparator 504 is coupled to a bias voltage Vb.

It will be appreciated that in a further embodiment the amplifier circuit may be implemented using a different type of amplifier, other than an OTA. For example, the amplifier circuit may be implemented using a standard operational amplifier or an inverter, such as the inverter 316, in accordance with the understanding of the skilled person.

The comparator 504 may be implemented using any of the inverters as described in FIGS. 3A-3E and therefore the coupling to the bias voltage Vb is merely for illustrative purposes, as the threshold voltage of the comparator 504 is determined by the bias voltage Vb as described previously. If the comparator 504 is implemented as an inverter it only has a single input. The comparator 504 outputs a digital signal Dout.

The switching circuit 502 comprises a first current source 514 and a second current source 516. The first current source 514 is coupled to the negative input of OTA 506 at a first node n1 and the second current source 516 is coupled to the positive input of OTA 506 at a second node n2.

The digital signal Dout that is output by the comparator 504 may be a logic high signal, represented by a "1", or a logic low signal, represented by a "0". The digital signal is provided to the switching circuit 502. A first current I1 provided by the first current source 514 is given by:

$$I1 = Dout \times Iref$$

where "Iref" is a reference current Iref. A second current I2 provided by the second current source 516 is given by:

$$I2 = (1 - Dout) \times Iref$$

Therefore, when the comparator 504 outputs a logic high signal, the first current source 514 is "on" and provides the reference current Iref; and the second current source 516 is "off" and does not provide a current. When the comparator 504 outputs a logic low signal, the second current source 516 is "on" and provided the reference current Iref; and the first current source 514 is "off" and does not provide a current.

Figure 6A:
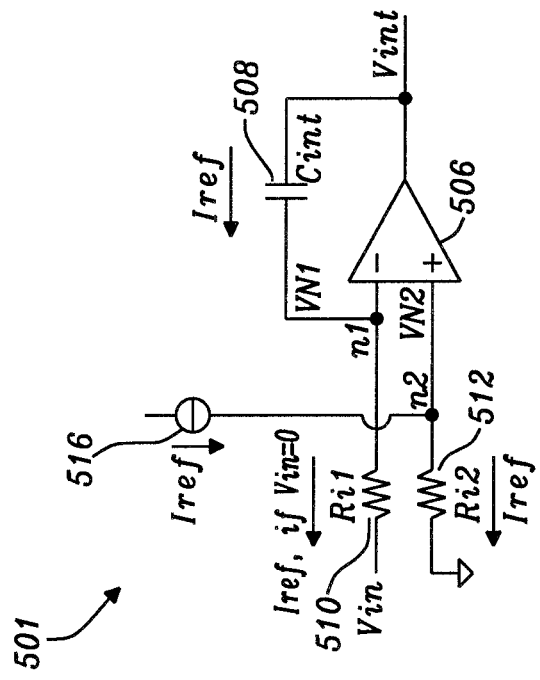
FIG. 6A is a schematic of an integrator circuit of the sigma-delta modulator of FIG. 5B in a first state.
Figure 6B:
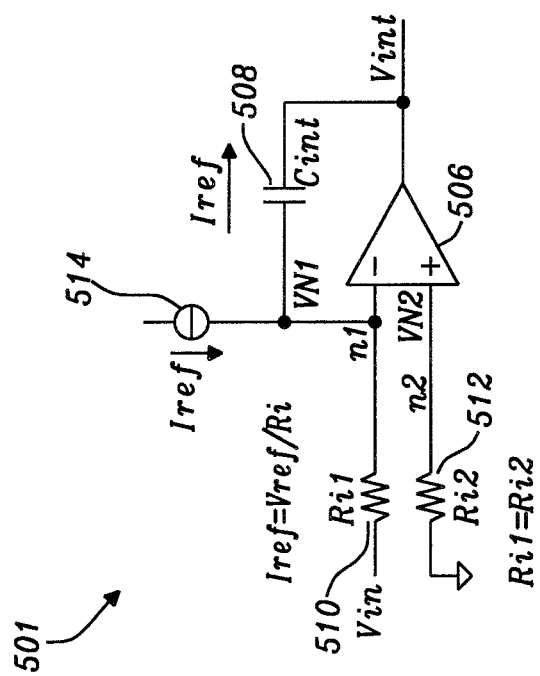
FIG. 6B is a schematic of the integrator circuit of the sigma-delta modulator of FIG. 5B in a second state.

FIG. 6A shows a schematic of the integrator circuit 501 when the first current source 514 is "on" and the second current source 516 is "off" (this may be referred to as a first state); and FIG. 6B shows a schematic of the integrator circuit 501 when the second current source 516 is "on" and the first current source 514 is "off" (this may be referred to as a second state).

In FIGS. 6A and 6B, the input voltage Vin is referred to ground and is therefore equal to zero. If the input voltage Vin is not equal to zero then a signal current is generated. The signal current is equal to is Vin/Ri1, where Vin is the input voltage and Ri1 is the resistance of the first resistor 510.

The switching circuit 502 offers an alternative to the switching circuit 14 of FIG. 1, where it is possible to change the sign of the gradient of the slope of the integrated voltage signal Vint without the need of a negative reference voltage (−Vref0) while the ground corresponds to 0V. In an alternative configuration where the ground is at a "mid-supply voltage" the switching circuit 502 can also eliminate the requirement for a negative reference voltage (−Vref0).

In operation, in FIG. 6A, there is no current at the second node n2 and therefore a second node voltage VN2 at the second node n2 is zero. OTA 506 maintains an equal voltage at both its inputs such that a first node voltage VN1 at the first node n1 is also zero. If the input voltage Vin is equal to zero, then the current through the first resistor 510 Ri1 is zero and the current through the first capacitor 508 Cint is equal to a negative of the reference current (−Iref). As the current through the first capacitor 508 Cint is less than zero, a rate of change of the integrated voltage signal Vint with time is less than zero, such that the integrated voltage signal Vint is falling, and therefore has a negative slope.

In operation, in FIG. 6B the reference current Iref flows through the second node n2 and therefore the second node voltage VN2 is equal to Iref×Ri2, where Iref is the reference current Iref and Ri2 is the resistance of the second resistor 512 Ri2. OTA 506 maintains the first node voltage VN1 equal to the second node voltage VN2. If the input voltage Vin is equal to zero, then the current through the first resistor 510 Ri1 is equal to the reference current Iref and the current through the first capacitor 508 Cint is equal to the reference current Iref. As the current through the first capacitor 508 Cint is greater than zero, a rate of change of the integrated voltage signal Vint with time is greater than zero, such that the integrated voltage signal Vint is rising, and therefore has a positive slope.

The two current sources 514, 516 are just representative of the operation of the switching circuit 502 and it will be seen later that a specific implementation of the switching circuit 502 uses only a single current source. Therefore, the current source that is in the "off" state is not shown in the associated schematic of the integrator circuit 501.

Therefore, the switching circuit 502 is arranged, as described above, to couple a single current source to the first input of the OTA 506 when in a first state and to couple the single current source to the second input of the OTA 506 when in a second state.

FIG. 7 shows specific implementations of 7A the switching circuit 502; 7B the OTA 506 of the integrator circuit 501; and 7C the comparator 504 that are suitable for implementation in the sigma-delta modulator 500 shown in FIG. 5B.

Any one, two or all three of the switching circuit 502, the integrator circuit 501 and the comparator 504 may be implemented in the sigma-delta modulator 500 of FIG. 5B.

The switching circuit 502 comprises a current source 800 and the current source comprises one of the bias transistors 503. In this specific embodiment, one of the bias transistors 503 corresponds to a current source transistor 802 that has a source coupled to the supply voltage Vddx and a gate coupled to the bias voltage Vb.

The supply voltage Vddx and the bias voltage Vb are generated by the LDO 300. It will be appreciated that in a further embodiment, the supply voltage Vddx and the bias voltage Vb may be generated using the LDO 100 or any other suitable voltage regulator in accordance with the understanding of the skilled person.

A drain of the current source transistor 802 is coupled to the first node n1 via a first switch 804 and is coupled to the second node n2 via a second switch 806.

Each of the first switch 804 and the second switch 806 are transistors with their source terminals coupled to the drain of the current source transistor 802. A drain of the first switch 804 is coupled to the first node n1, and a drain of the second switch 806 is coupled to the second node n2. A gate of the first switch 804 is coupled to an inverted digital signal $\overline{Dout}$ and gate of the second switch 806 is coupled to the digital signal Dout. The inverted digital signal $\overline{Dout}$ is the inverse of the digital signal Dout.

It will be appreciated that in the switching circuit 502, the current source 800 may be implemented as a cascode current source as described previously and in accordance with the understanding of the skilled person.

When the digital signal Dout is a logic high signal (herein referred to as "high") and the inverted digital signal $\overline{Dout}$ is a logic low signal (herein referred to as "low"), the first switch 804 is in an on state, such that it permits current to flow from the current source 800 to the first node n1; and the second switch 806 is in an off state, such that it prevents current flow.

When the digital signal Dout is low and the inverter digital signal $\overline{Dout}$ is high, the first switch 804 is in an off state, such that it prevents current flow; and the second switch 806 is in an on state such that it permits current to flow from the current source 800 to the second node n2.

Therefore, the switching circuit 502 changes state in response to receiving the digital signal Dout and inverted digital signal $\overline{Dout}$. As $\overline{Dout}$ is an inverted version of Dout and is derived from Dout, it may be said the that the switching circuit 502 changes state in response to a single feedback signal, namely the digital signal Dout.

Current flow through different parts of each of the circuits 502, 506, 504 is shown by the reference current Iref in the schematics. "2*Iref" denotes that the current flow through that particular region is equal to twice the reference current Iref. The reference current Iref defines an input range of the sigma-delta modulator 500. A reference voltage Vref is as follows:

$$Vref=Iref \times Rref$$

where Rref is proportional or equal to the resistances of each of the first and second resistors 510 Ri1, 512 Ri2. Preferably, Ri1 and Ri2 are equal. For example, Rref, Ri1 and Ri2 may all be equal (Rref=Ri1=Ri2). The reference current Iref is as provided by the current source 800 of the switching circuit 502, and as described previously. Typical values for a practical implementation of the sigma-delta modulator 500 may be as follows: Vref=10 mV; Iref=10 nA; and Rref=1 MΩ.

The switching circuit 502 shown in FIG. 7A may be referred to as a modulated current source. Optionally a cascode transistor (having a size equal to that of the first cascode regulator transistor 302) may be coupled between the drain of current source transistor 802 and the sources of the switches 804, 806. The sizing of the transistors 804, 806 is not critical, as the voltage drop over each switches 804, 806 when in the on state, will have minimal impact on the reference current Iref.

As discussed previously, and described in FIGS. 6A and 6B, if the digital signal Dout is low (equal to zero) then the reference current Iref is injected into node n2. The results in a rising integrated voltage signal Vint, with a positive slope, while the input voltage Vin is smaller than a positive level of an input scale (for example if Vin is less than +Vref). If the integrated voltage signal Vint becomes larger than the bias voltage Vb, then the comparator 504 will output a high digital signal Dout (equal to one). Then the reference current Iref is injected into the first node, thereby resulting in a falling integrated voltage signal Vint with a negative slope while the input voltage Vin is larger than a negative level of the input scale (for example if Vin is greater than −Vref).

The integrator circuit 501 comprises OTA 506 and is arranged to generate an integrated voltage signal Vint. The OTA 506 of the integrator circuit 501 is realized in common bias configuration.

The OTA 506 comprises at least one of the bias transistors 503. The OTA 506 may comprise a current source comprising one of the bias transistors 503.

The OTA 506 comprises a current divider that comprises a current source, which comprises one of the bias transistors 503. In this specific embodiment, the OTA 506 of the integrator circuit 501 comprises a differential pair 808, which is configured to operate as the current divider.

The differential pair 808 comprises a second current source 810, which comprises a current source transistor 812 that has a source coupled to the supply voltage Vddx and a gate coupled to the bias voltage Vb. The supply voltage Vddx and the bias voltage Vb are generated by the LDO 300. The differential pair 808 further comprises a first switch 814 and a second switch 816. A drain of the current source transistor 812 is coupled to a first output node NO1 via the first switch 814 and the coupled to a second output node NO2 via the second switch 816. The switches 814 and 816 are transistors; a gate of the first switch 814 is coupled to the first node n1 for receiving the first node voltage VN1 and a gate of the second switch 816 is coupled to the second node n2 for receiving the second node voltage VN2.

In this specific embodiment, one of the bias transistors 503 corresponds to the current source transistor 812.

In this specific embodiment, the differential pair 808 corresponds to the current divider 400 as described previously. The current divider 400 is chosen as the node voltages VN1, VN2 received by the OTA 506 are approximately equal to, or less than the bias voltage Vb. In a further embodiment, if the node voltages VN1, VN2 are approximately equal to or greater than the bias voltage Vb then the current divider 408 may be implemented in the OTA 506, in accordance with the understanding of the skilled person.

In a further embodiment, if the node voltages VN1, VN2 are less than the supply voltage Vddx and greater than ground, then both current dividers 400, 408 may be implemented in the OTA 506. Such an OTA 506 may be referred to as a "rail-to-rail" OTA.

With regards to the operation of the current divider 400 (or the current divider 408 in the further embodiment), if the node voltages VN1, VN2 are equal then the current divider is said to be "in balance" such that the two currents output by the current divider 400 are equal, as shown by lq/2 in FIG. 4E. If the node voltages VN1, VN2 are unequal then the two currents output by the current divider 400 will be unequal. The difference in the output currents is converted into an output current of the OTA 506.

The OTA 506 further comprises first and second cascode current sources 818, 820 in sinking configurations. The first cascode current source 818 comprises a first bias transistor configured to generate a first current and a second bias transistor configured to function as a cascode transistor. The second cascode current source 820 comprises a third bias transistor configured to generate a second current and a fourth bias transistor configured to function as a cascode transistor.

In this specific embodiment, the first cascode current source 818 comprises a cascode transistor 822 with a source coupled to a drain of a current source transistor 826 via a first input node NI1; and the second cascode current source 820 comprises a cascode transistor 824 with a source coupled to a drain of a current source transistor 828 via a second input node NI2. The gates of the four transistors 822, 824, 826, 828 are coupled to the bias voltage Vb. The source of the current source transistors 826, 828 are coupled to ground. The first and second output nodes NO1, NO2 are coupled to the first and second input nodes NI1, NI2, respectively.

The OTA 506 further comprises a current mirror 830 comprising two current mirror transistors 832, 834. The current mirror transistors 832, 834 have their sources coupled to the supply voltage Vddx and their gates coupled together. A drain of the current mirror transistor 832 is coupled to its gate and also to a drain of the cascode transistor 822. A drain of the current mirror transistor 834 is coupled to a drain of the cascode transistor 824 via an integrator output node NO3. The integrated voltage signal Vint is output from the integrator output node NO3.

All gates of the current source transistors 812, 826, 828 and the cascode transistors 822, 824 of the OTA 506 are coupled to the same bias voltage Vb as is characteristics of a common bias OTA. Therefore in this specific embodiment of the OTA 506, five of the bias transistors 503 correspond to the transistors 812, 822, 824, 826, 828.

A drain-source voltage of the current source transistor 812 is equal to a drain source voltage of the transistor 102 of the LDO 300 because the differential pair is implemented by splitting a cascode transistor of a cascode current source, as described previously, into two equal, parallel coupled transistors to form the differential pair 808.

The comparator 504 is arranged to receive the integrated voltage signal Vint from the integrator circuit 501 and to generate the digital signal Dout.

The comparator 504 comprises an inverter 836. The inverter 836 corresponds to the inverter 120 as shown in FIG. 2D, however it will be appreciated that the inverter 836 may correspond to any of the inverters as described in FIGS. 3A-3E or the inverter of FIG. 4D.

The inverter 836 is configured to receive the supply voltage Vddx from a voltage regulator, for example from the LDO 300. As described for the inverters of FIGS. 3A-3E, an output voltage of the inverter 836 is dependent on an input voltage received by the inverter and the bias voltage Vb.

The inverter 836 has an input coupled to the integrator circuit 501 output node NO3 and provides an output coupled to a first inverter 838. The first inverter 838 outputs the digital signal Dout to the switching circuit 502 and to the additional circuitry 505. An output of the first inverter 838 is coupled to a second inverter 840. The second inverter 840 inverts the digital signal Dout and outputs the inverted digital signal $\overline{Dout}$. The inverted digital signal $\overline{Dout}$ is provided to the switching circuit 502.

As mentioned previously, the threshold voltage of the comparator 504 is at the bias voltage Vb. When an input of the comparator 504 is at the bias voltage Vb, the reference current Iref flowing through the transistors 116, 118 of the comparator 504 is at its maximum value.

It will be appreciated that in a further embodiment, and in accordance with the understanding of the skilled person, the comparator 504 may be implemented using an OTA, for example an OTA equivalent to the OTA 506 that is shown in FIG. 7B.

The sigma-delta modulator 500 comprises the bias transistors 802, 812, 822, 824, 826, 828. The bias transistors 802, 812 are p-type transistors and the bias transistors 822, 824, 826, 828 are n-type transistors. It will be appreciated that the transistor type may be altered in accordance with the understanding of the skilled person.

In a preferred embodiment of the sigma-delta modulator 500, the transistor sizes may be as follows: the current source transistor 802 of equal size to the first regulator transistor 102; the current source transistor 812 equal to twice the size of the first regulator transistor 102; each of the current mirror transistors 832, 834 of equal size to the first regulator transistor 102; the current source transistor 828 equal to twice the size of the second regulator transistor 104; the cascode transistor 824 much greater in size than the current source transistor 828; each of the switches 814, 816 much greater in size than the first regulator transistor 102; the first current source transistor 116 of equal size to the first regulator transistor 102; and the second current source transistor 118 of equal size to the second regulator transistor 104.

In will be appreciated that the transistors may be sized differently in accordance with the understanding of the skilled person.

The total quiescent current of the sigma-delta modulator 500 is 8 times Iref, which may be as low as 80 nA if Iref=10 nA. The total quiescent current is related to the power efficiency of a circuit, and it is desirable to minimise the quiescent current.

A reference voltage Vref of 10 mV is suggested, which sets an input scale to ±10 mV. This is a suitable target range for the input scale to adequately convert current flow through a current-sense resistor into a digital value. ±1 Ampere over a 10 mΩ current sense resistor corresponds to the ±10 mV input scale.

A Coulomb counter may be used to measure a charge and a discharge current of a battery. The sigma-delta modulator 500 of this disclosure may be implemented in a Coulomb counter. It is necessary to apply chopping in the implementation of the sigma-delta modulator 500 in a Coulomb counter. Chopping refers to the switching of the sign of the integrated voltage signal Vint and the digital signal Dout. By chopping, any offset of the integrated voltage signal Vint and the digital signal Dout are cancelled. Since charging/discharging a battery is a slow process, it is sufficient to chop just once per second.

In a practical Coulomb counter, it is estimated that implementation of the sigma-delta modulator 500 would result in a quiescent current of only 100 nA. This demonstrates the power efficiency of the common bias circuits, as other solutions consume 10 to 1000 times more power.

The common bias sigma-delta modulator 500 can also be configured as a high-speed modulator. This requires an increase in the reference current Iref (greater than 10 nA as described previously). However, even with the larger reference current Iref, the power efficiency of the common bias sigma-delta modulator 500 will still result in significantly reduced power consumption if compared with prior art sigma-delta modulators such as the sigma-delta modulator 10 shown in FIG. 1.

In a further embodiment, the current source transistor 802 may also be digitally weighted to realize a multi-bit sigma-delta modulator.

The sigma-delta modulator 500 as described previously may be referred to as a 1 bit sigma-delta modulator. This is a result of the switching circuit 502 providing a reference current Iref to one of the two nodes n1, n2 depending on the configuration of the switches 804, 806. The integrator circuit 501 with the switching configuration shown in FIG. 6A may be considered to be receiving the reference current Iref with a negative sign: −Iref; whereas the integrator circuit 501 with the switching configuration shown in FIG. 6B may be considered to be receiving the reference current Iref with a positive sign: +Iref. Consequently, the two states of the 1 bit sigma-delta modulator 500 may be represented by: +Iref and −Iref.

In a further embodiment of this disclosure, a 2 bit sigma-delta modulator, may correspond to the 1 bit sigma-delta modulator, with the current source transistor 802 of the switching circuit 502 being divided into four current source transistors of approximately equal size, where each of the four current source transistors are approximately a quarter of the size of the initial current source transistor 802.

In the 2 bit sigma-delta modulator, the reference current Iref may be represented by the following values: +1*Iref, +¾*Iref, +2/4*Iref, +¼*Iref, −¼*Iref, −½*Iref, −¾*Iref, or −1*Iref.

By barrel shifting (rotating address lines of the switches which enable and disable the four current source transistors) a mismatch in the transistor sizes is averaged out over the oversampling period.

The sigma-delta modulators presented herein can provide an improvement in power efficiency when compared with sigma-delta modulators of the prior art.

Various improvements and modifications may be made to the above without departing from the scope of the disclosure.

What is claimed is:

1. A sigma-delta modulator for converting an input voltage into a digital signal, comprising:
   a plurality of bias transistors comprising at least one p-type transistor and at least one n-type transistor and configured to receive a bias voltage; wherein:
   each bias transistor receives the same bias voltage.

2. The sigma-delta modulator of claim 1, wherein each of the bias transistors receives the bias voltage at its gate.

3. The sigma-delta modulator of claim 1, wherein the sigma-delta modulator is configured to receive a supply voltage from a voltage regulator that is configured to generate the supply voltage and the bias voltage.

4. The sigma-delta modulator of claim 3, comprising:
a comparator comprising an inverter configured to receive the supply voltage from the voltage regulator; wherein:
an output voltage of the inverter is dependent on:
a) an input voltage received by the inverter; and
b) the bias voltage.

5. The sigma-delta modulator of claim 1, comprising an amplifier circuit comprising at least one of the bias transistors.

6. The sigma-delta modulator of claim 5, comprising an integrator circuit comprising the amplifier circuit.

7. The sigma-delta modulator of claim 5, comprising a switching circuit; wherein
the switching circuit comprises a current source; and
the current source comprises one of the bias transistors.

8. The sigma-delta modulator of claim 7, comprising:
an integrator circuit comprising the amplifier circuit, and arranged to generate an integrated voltage signal, wherein:
the switching circuit is arranged to couple the current source to a first input of the amplifier circuit when in a first state; and
the switching circuit is arranged to couple the current source to a second input of the amplifier circuit when in a second state.

9. The sigma-delta modulator of claim 8, wherein the switching circuit is configured to change state in response to receiving a feedback signal.

10. The sigma-delta modulator of claim 5, wherein the amplifier circuit comprises a current source comprising one of the bias transistors.

11. The sigma-delta modulator of claim 5, wherein the amplifier circuit comprises a first cascode current source comprising:
a first bias transistor configured to generate a first current; and
a second bias transistor configured to function as a cascode transistor.

12. The sigma-delta modulator of claim 10, wherein the amplifier circuit comprises a second cascode current source comprising:
a third bias transistor configured to generate a second current; and
a fourth bias transistor configured to function as a cascode transistor.

13. The sigma-delta modulator of claim 5, wherein the amplifier circuit comprises a current divider; wherein:
the current divider comprises a current source; and
the current source comprises one of the bias transistors.

14. The sigma-delta modulator of claim 8, comprising a comparator arranged to receive the integrated voltage signal and to generate the digital signal.

15. The sigma-delta modulator of claim 14, wherein:
the switching circuit is configured to change state in response to receiving a feedback signal; and
the feedback signal is the digital signal generated by the comparator.

16. The sigma-delta modulator of claim 14, comprising:
a clock for generating a clock signal; and
a counting circuit, wherein:
the counting circuit is arranged to receive the digital signal; and
to generate a digital value, the digital value being a number of cycles of the clock signal over which the digital signal is in a high logic state during a measurement period.

17. The sigma-delta modulator of claim 1, wherein the sigma-delta modulator is a multi-bit sigma-delta modulator.

18. The sigma-delta modulator of claim 5, wherein the amplifier circuit is an operational transconductance amplifier.

19. A method of sigma-delta modulation comprising:
converting an input voltage into a digital signal;
receiving a bias voltage at a plurality of bias transistors comprising at least one p-type transistor and at least one n-type transistor; wherein:
each bias transistor receives the same bias voltage.

* * * * *